US012801820B2

(12) United States Patent
Wang et al.

(10) Patent No.: US 12,801,820 B2
(45) Date of Patent: Nov. 17, 2026

(54) CONTROL SET OPTIMIZATION FOR IMPLEMENTING CIRCUIT DESIGNS IN INTEGRATED CIRCUIT DEVICES

(71) Applicant: Xilinx, Inc., San Jose, CA (US)

(72) Inventors: Jichun Wang, San Jose, CA (US); Wuxi Li, San Bruno, CA (US); Chun Zhang, San Jose, CA (US); Paul Kundarewich, Toronto (CA); John Blaine, Surrey (GB)

(73) Assignee: Xilinx, Inc., San Jose, CA (US)

( * ) Notice: Subject to any disclaimer, the term of this patent is extended or adjusted under 35 U.S.C. 154(b) by 827 days.

(21) Appl. No.: 18/193,197

(22) Filed: Mar. 30, 2023

(65) Prior Publication Data

US 2024/0330558 A1 Oct. 3, 2024

(51) Int. Cl.
*G06F 30/392* (2020.01)

(52) U.S. Cl.
CPC .................................. *G06F 30/392* (2020.01)

(58) Field of Classification Search
CPC .... G06F 18/2178; G06F 18/217; G06F 18/21; G06F 3/0608; G06F 3/0619; G06F 3/0635; G06F 3/067; G06F 16/245; G06F 21/6245; G06F 2119/12; G06F 30/327; G06F 30/392; G06F 2218/00; G06F 18/20; G06F 21/10; G06F 16/24
USPC .................................................. 716/118–125
See application file for complete search history.

(56) References Cited

U.S. PATENT DOCUMENTS

| | | | | |
|---|---|---|---|---|
| 8,230,377 | B1 | 7/2012 | Fang | |
| 10,252,150 | B1 | 4/2019 | Kim | |
| 11,132,484 | B1 * | 9/2021 | Neuveux | G01R 31/3177 |
| 11,494,540 | B1 * | 11/2022 | Sircar | G06F 30/373 |
| 2022/0399881 | A1 * | 12/2022 | Jadhav | H03K 3/0372 |

OTHER PUBLICATIONS

W. Li and D. Z. Pan, “A New Paradigm for FPGA Placement Without Explicit Packing,” in IEEE TCAD, vol. 38, No. 11, pp. 2113-2126, Nov. 2019.

* cited by examiner

*Primary Examiner* — Binh C Tat
(74) *Attorney, Agent, or Firm* — Kevin T. Cuenot

(57) ABSTRACT

Implementing circuit designs in integrated circuit devices includes determining, using computer hardware, regular control sets, super control sets, and mega control sets for a circuit design. Control set optimization is performed on the circuit design. Performing control set optimization includes performing a clock-enable-only control set reduction for each super control set. Performing control set optimization includes performing a set/reset control set reduction and a clock-enable control set reduction for each mega control set. The circuit design is selectively modified by committing changes determined from the control set reductions to the circuit design on a per control set basis based on an improvement of a cost metric for each control set.

20 Claims, 10 Drawing Sheets

CONTROL SET OPTIMIZATION FOR IMPLEMENTING CIRCUIT DESIGNS IN INTEGRATED CIRCUIT DEVICES

TECHNICAL FIELD

This disclosure relates to integrated circuits (ICs) and, more particularly, to control set optimization for implementing a circuit design within an IC.

BACKGROUND

Integrated circuit devices (ICs) include a variety of different types of circuit blocks. The underlying architecture of the IC imposes limitations on the particular functions and/or circuit design elements that may be assigned to the circuit blocks. For example, circuit blocks may be constrained architecturally to be able to receive a limited number of control signals. A circuit block may be limited as to the number of clock signals, set/reset signals, and/or clock-enable signals that can be used to drive the circuit block. As such, for certain circuit design elements to be located in a same circuit block, those circuit design elements may need to be driven by a same clock signal, a same set/reset signal, and/or a same clock-enable signal.

The term "control set" refers to a combination of a particular clock signal, a particular set/reset signal, and particular clock-enable signal provided to a circuit design element. Those circuit design elements that are driven by a same clock signal, a same set/reset signal, and a same clock-enable signal may be said to be in a same control set group. In view of the architectural limitations discussed, those circuit designs with a larger number of different control sets may be more difficult, if not infeasible, to implement in a particular IC (referred to herein as the "target IC").

For example, placing a particular circuit design element belonging to a first control set group in a circuit block may prevent other circuit design elements belonging to a different control set group from being assigned to an available site in that same circuit block. This often means that for circuit designs having a large number of control set groups, some circuit blocks may have significant numbers of sites go unused. As a result, circuit designs with complicated control signal settings may undergo significant perturbation during placement legalization, which can lead to significant timing, power, and routability degradation in the final result. As noted, in some cases, implementation of the circuit design in the target IC becomes infeasible.

SUMMARY

In one or more example implementations, a method includes determining, using computer hardware, regular control sets, super control sets, and mega control sets for a circuit design. The method includes performing, using the computer hardware, control set optimization on the circuit design. Performing control set optimization includes performing a clock-enable-only control set reduction for each super control set. Performing control set optimization includes performing a set/reset control set reduction and a clock-enable control set reduction for each mega control set. The method also includes selectively modifying the circuit design by committing changes determined from the control set reductions to the circuit design on a per control set basis based on an improvement of a cost metric for each control set.

The foregoing and other implementations can each optionally include one or more of the following features, alone or in combination. Some example implementations include all the following features in combination.

In some aspects, the performing of control set optimization is performed prior to floor-planning the circuit design.

In some aspects, the method includes allocating flip-flops of the circuit design to a specified number of groups prior to determining the control sets. The determining of the regular control sets, the super control sets, and the mega control sets is performed on a per-group basis. The performing control set optimization on the circuit design is performed on a per-group basis.

In some aspects, the method includes floor-planning the circuit design and performing the control set optimization on the circuit design again subsequent to the floor-planning.

In some aspects, the control set optimization, as performed on the circuit design subsequent to the floor-planning, is performed for each of a plurality of locations of a window moved across a target integrated circuit for the circuit design.

In some aspects, for a selected super control set, fewer than all flip-flops of the selected super control set are processed during the clock-enable-only control set reduction. In some aspects, for a selected mega control set including a plurality of subgroups, the set/reset control set reduction and the clock-enable control set reduction is performed for fewer than all subgroups of the plurality of subgroups.

In some aspects, non-reducible flip-flops of the circuit design are excluded from the control set reductions.

In one or more example implementations, a system includes one or more hardware processors configured (e.g., programmed) to initiate and/or execute operations as described within this disclosure.

In one or more example implementations, a computer program product includes one or more computer readable storage mediums having program instructions embodied therewith. The program instructions are executable by computer hardware, e.g., a hardware processor, to cause the computer hardware to initiate and/or execute operations as described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
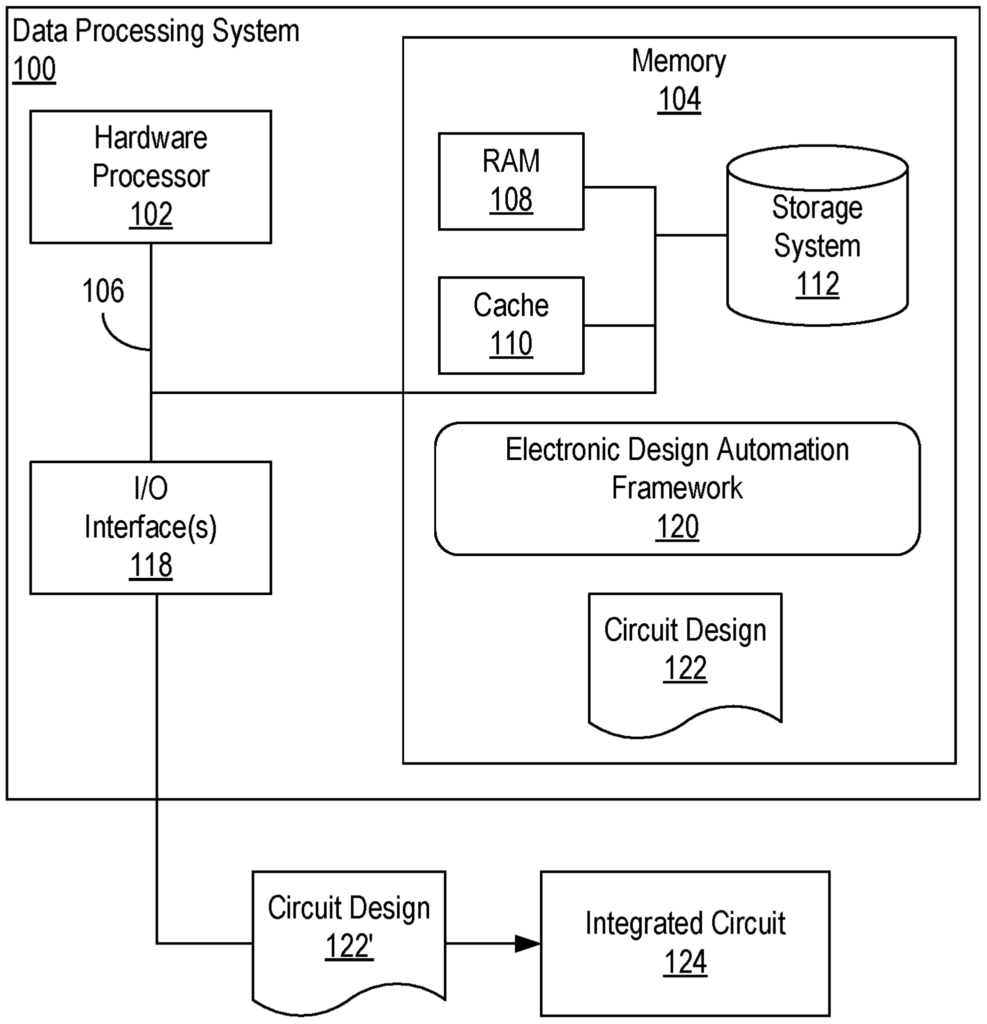
FIG. 1 illustrates an example implementation of a data processing system for use with the inventive arrangements described within this disclosure.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to reducing control sets for implementing a circuit design within an IC. The inventive arrangements are applicable to circuit designs intended for implementation in ICs that have existing circuit architectures over and/or in which the circuit designs may be implemented. As an example, the various techniques described herein may be applied to circuit designs that are to be implemented in Field Programmable Gate Array (FPGA) type devices.

The inventive arrangements provide one or more implementation flows and algorithmic solutions for implementing a circuit design within a target IC while contending with control sets. In accordance with the inventive arrangements described herein, particular flip-flop (FF) components may be selected as candidates for application of control set optimization that improves FF resource sharing in the target IC for the circuit design. In some aspects, one or more selection techniques are disclosed for determining which FF components of a circuit design will undergo processing to reduce the number of control sets of the circuit design and/or to reduce the number of FF components in particular control sets.

In accordance with the inventive arrangements described within this disclosure, the control set optimization(s) may be incorporated into one or more places within a design flow. In one aspect, the control set optimization techniques described herein may be incorporated into a design flow prior to the availability of location information for components of the circuit design with respect to the target IC. In addition and/or in the alternative, the control set optimization techniques described herein may be performed subsequent to the availability of such location information. Depending on the particular place or places within the design flow where the control set optimization techniques are performed on the circuit design, the control set optimization techniques may be applied and/or implemented using different strategies. These different strategies may depend on the availability of location information for components of the circuit design being processed.

In one or more example implementations, the control set optimization techniques described herein may be applied to configurable logic block (CLB) type circuit blocks of an IC. A CLB typically includes a variety of different interconnected circuit elements such as a plurality of lookup-tables (LUTs) and a plurality of flip-flops (FFs). The FF sites of a CLB are constrained as to the number of FF components of different control sets that may be accommodated. That is, placing a FF component of a circuit design driven by a particular control set at a FF site of a CLB will constrain or limit the other FF components of the circuit design that may be placed at other available FF sites of the CLB based on the control set(s) of such other FF components. This may leave certain sites of the CLB unoccupied after the circuit design has been placed.

For example, consider the case where a slice of a CLB includes 16 FF sites. If all FF components of have different control signals, in the worst case, that slice will host at most 1 FF component of the circuit design assigned thereto leaving the other 15 FF sites empty. This illustrates that circuit designs having complicated control signal settings often experience significant perturbation during placement legalization. This can lead to significant timing, power, and routability degradation of the circuit design as implemented in the target IC. As noted, in some cases, finding a legal placement for the circuit design is not feasible.

In performing the control set optimization(s) described herein, one or more of the implementation tools are able to generate an improved Quality-of-Result (QoR) for the resulting circuit design as implemented in the target IC. The processing described herein allows a larger number of FF components to be legally included in a same CLB and/or slice of a CLB. This may result in improvements in timing, power, and routability of the circuit design. In some cases, a circuit design that is otherwise infeasible to legally place in a target IC may be placed.

For example, by operation of the control set optimization (s), a placer is able to operate with increased flexibility to determine a legal placement of the circuit design. The placer is capable of generating a placement solution with an improved QoR, e.g., reduced displacement, improved wirelength, and/or reduced power consumption. The router portion of the implementation tools benefit from the improved QoR of the placement solution to generate a routing solution that utilizes fewer routing resources of the target IC.

Further aspects of the inventive arrangements are described below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example implementation of a data processing system 100. As defined herein, the term "data processing system" means one or more hardware systems configured to process data, each hardware system including at least one hardware processor and memory, wherein the hardware processor is programmed with computer-readable instructions that, upon execution, initiate operations. Data processing system 100 can include a hardware processor 102, a memory 104, and a bus 106 that couples various system components such as memory 104 to hardware processor 102.

Hardware processor 102 may be implemented as one or more circuits capable of carrying out instructions contained in program code. The circuits may be implemented as an integrated circuit or embedded in an integrated circuit. In an example, hardware processor 102 is implemented as a central processing unit (CPU). Hardware processor 102 may be implemented using a complex instruction set computer architecture (CISC), a reduced instruction set computer architecture (RISC), a vector processing architecture, or other known architectures. Example hardware processors include, but are not limited to, hardware processors having an x86 type of architecture (IA-32, IA-64, etc.), Power Architecture, ARM processors, and the like.

Bus 106 represents one or more of any of a variety of communication bus structures. By way of example, and not limitation, bus 106 may be implemented as a Peripheral Component Interconnect Express (PCIe) bus.

Data processing system 100 typically includes a variety of computer system readable media. Such media may include computer-readable volatile and non-volatile media and computer-readable removable and non-removable media. In the example, memory 104 includes computer-readable media in the form of volatile memory, such as random-access memory (RAM) 108 and/or cache memory 110. Data processing system 100 also can include other removable/non-removable, volatile/non-volatile computer storage media. By way of example, storage system 112 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 106 by one or more data media interfaces. Memory 104 is an example of at least one computer program product.

Memory 104 is capable of storing computer-readable program instructions that are executable by hardware processor 102. For example, the computer-readable program instructions can include an operating system, one or more application programs, other program code, and program data. In the example, the computer-readable program instructions can include an Electronic Design Automation (EDA) framework 120. In one or more example implementations, EDA framework 120 is capable of performing a design flow.

A design flow refers to a multi-phase process applied to a circuit design such as circuit design 122. A design flow typically includes synthesis, placement, and routing. In general, synthesis refers to the process of generating a gate-level netlist from a high-level description of a circuit or system specified in circuit design 122. The netlist may be technology specific in that the netlist is intended for implementation in a target IC. Placement refers to the process of assigning elements of the synthesized circuit design to particular resources of the target IC (e.g., to particular instances of circuit blocks, available sites of a circuit block, and/or other resources of the target IC having specific locations on the target IC). Routing refers to the process of selecting or implementing particular routing resources, e.g., wires and/or other interconnect circuitry, to electrically couple the various circuit blocks of the target IC after placement. The resulting circuit design, e.g., circuit design 122', having been processed through the design flow by EDA framework 120, may be physically realized, e.g., implemented, within an IC 124. It should be appreciated that EDA framework 120 may include program code to implement each of the aforementioned stages of the design flow (e.g., a synthesizer, a placer, and a router).

Within this disclosure, the term "component" is used to refer to an element of a user circuit design. The term "site," "resource," and/or "circuit block" is intended to refer to particular circuitry on a target IC to which a component of a user circuit design is to be mapped or assigned. The target IC is the particular IC, e.g., IC 124, in which a given circuit design such as circuit design 122, is to be physically realized.

Hardware processor 102, in executing the computer-readable program instructions, is capable of performing the various operations described herein that are attributable to a computer. It should be appreciated that data items used, generated, and/or operated upon by data processing system 100 are functional data structures that impart functionality when employed by data processing system 100. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a hardware processor.

IC 124 may be implemented as any of a variety of different types of ICs that include at least some programmable circuitry. For example, IC 124 may be implemented as a System-on-Chip (SoC), an Application-Specific IC (ASIC), an adaptive IC (e.g., a programmable IC such as an FPGA), or the like. An adaptive IC is an IC that may be updated subsequent to deployment of the device into the field. An adaptive IC may be optimized, e.g., configured or reconfigured, for performing particular operations after deployment. The optimization may be performed repeatedly over time and in the field to meet different requirements or needs. A programmable IC includes any IC that includes at least some programmable circuitry. Examples of programmable circuitry include programmable logic and/or FPGA circuitry.

Data processing system 100 may include one or more Input/Output (I/O) interfaces 118 communicatively linked to bus 106. I/O interface(s) 118 allow data processing system 100 to communicate with one or more external devices and/or communicate over one or more networks such as a local area network (LAN), a wide area network (WAN), and/or a public network (e.g., the Internet). Examples of I/O interfaces 118 may include, but are not limited to, network cards, modems, network adapters, hardware controllers, etc. Examples of external devices also may include devices that allow a user to interact with data processing system 100 (e.g., a display, a keyboard, and/or a pointing device) and/or other devices such as a circuit board or card on which IC 124 may be disposed.

Data processing system 100 is only one example implementation of computer hardware. Data processing system 100 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

Figure 2:
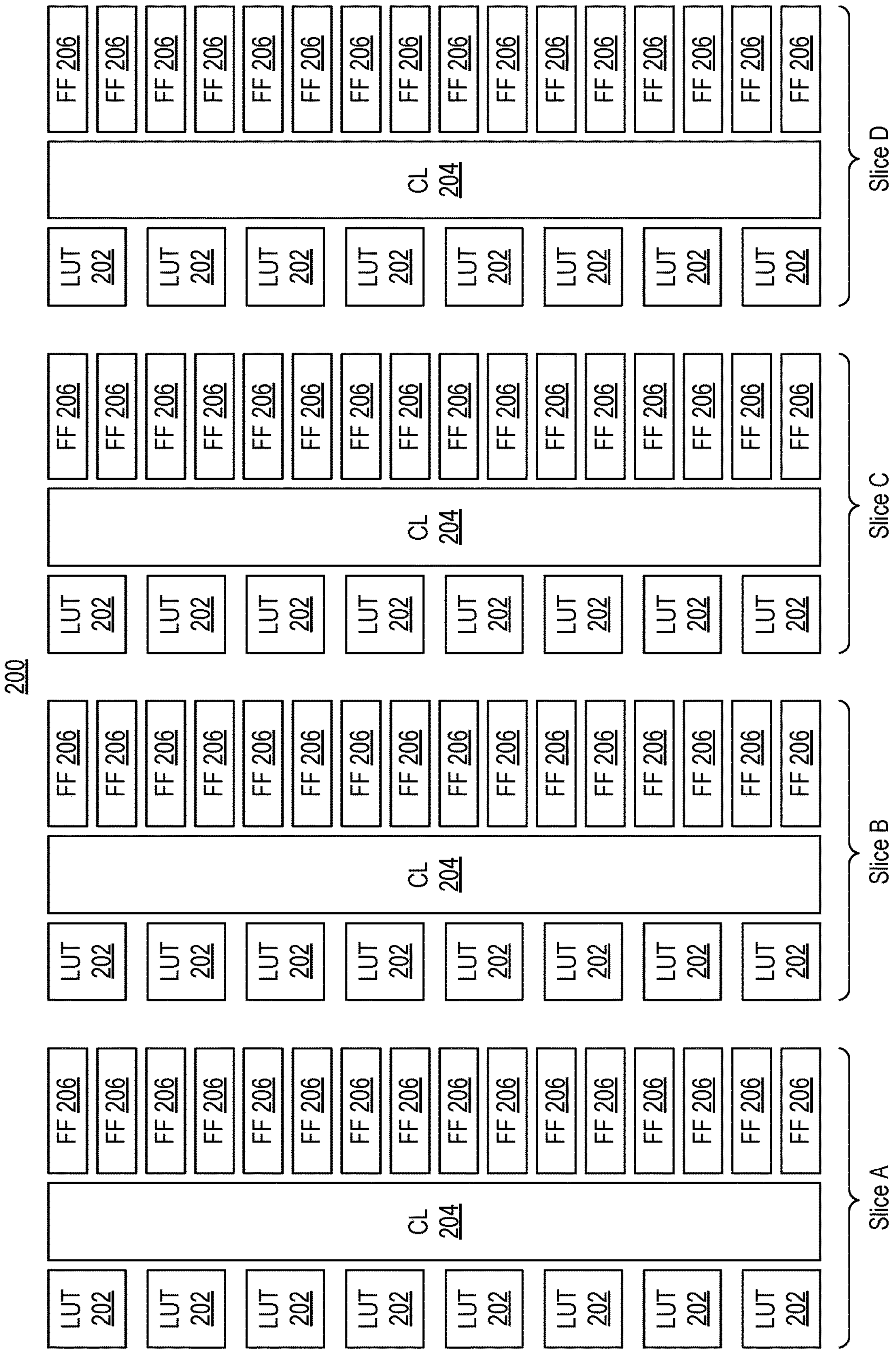
FIG. 2 illustrates an example of a configurable logic block (CLB).

FIG. 2 illustrates an example of a CLB 200. IC 124, for example, may include a plurality of CLBs 200. An example architecture for IC 124 including a plurality of CLBs such as CLB 200 is described in connection with FIG. 10. As illustrated, the CLBs, e.g., circuit blocks of the target IC, may be organized in columns and/or rows as part of a tiled architecture of IC 124.

In the example, CLB 200 is subdivided into a plurality of slices A, B, C, and D. Each slice, e.g., a portion of the CLB type circuit block, includes 8 LUT resources 202, carry logic resources 204, and 16 FF sites 206. Certain other circuit structures of CLB 200 have been omitted for ease of illustration. For example, CLB 200 may include additional interconnect circuitry linking one or more or all of slices A, B, C, and/or D. Based on the example of FIG. 2, each slice A, B, C, and/or D of CLB 200 may be assigned up to 16 different FF components from circuit design 122. CLB 200 has particular requirements as to the number of FF components of different control sets that may be assigned to a same slice.

Figure 3:
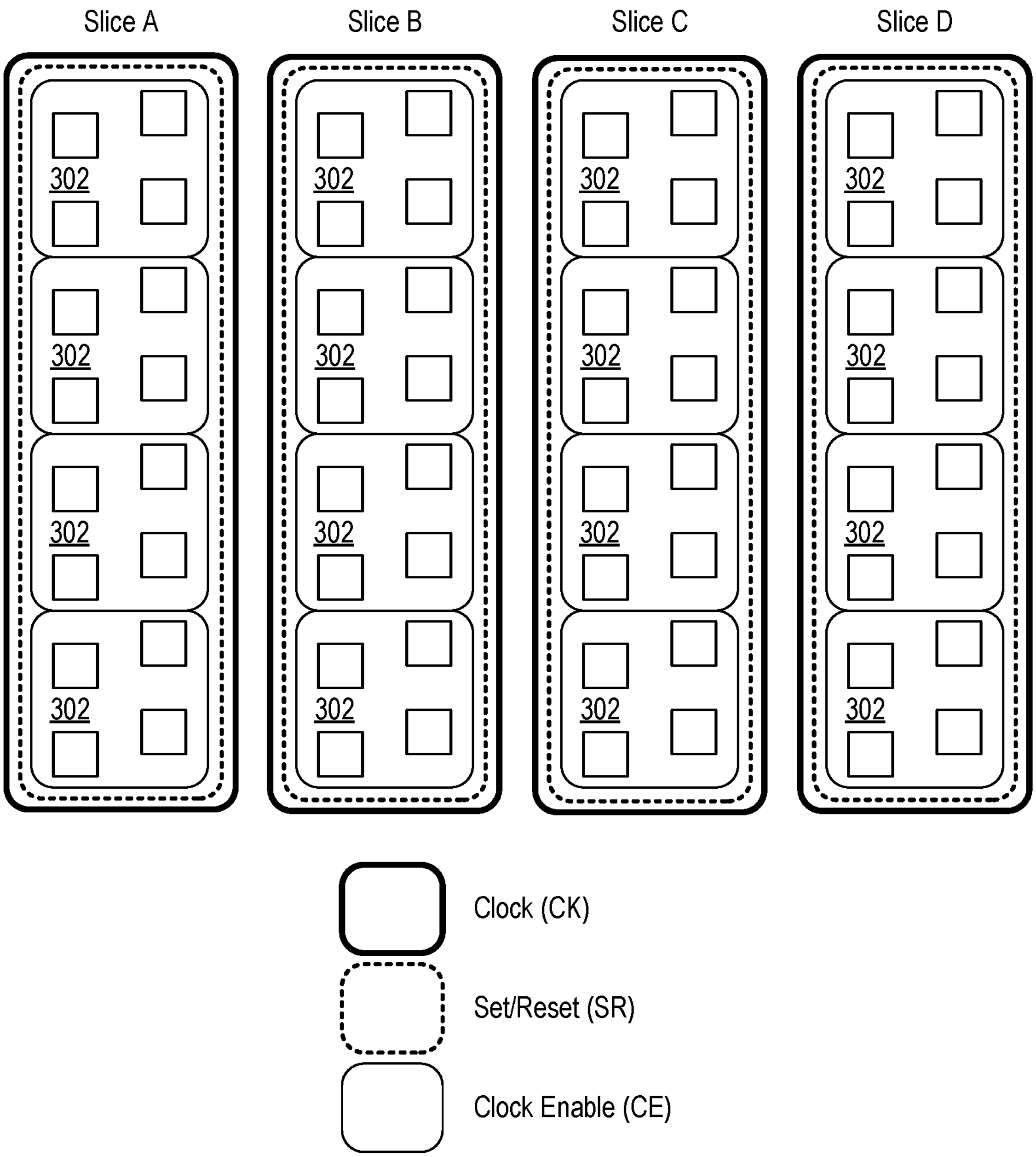
FIG. 3 illustrates another example of a CLB.

FIG. 3 illustrates another example of CLB 200. In the example of FIG. 3, only the FF sites of slices A, B, C, and D are illustrated. As shown, each slice may only include FF components having a same clock (CLK) signal. Each slice may only include FF components that have the same set/reset (SR) signal. Each slice is also organized into 4 subgroups 302 with each subgroup 302 including 4 FF sites. Each subgroup may only include FF components having the same clock-enable (CE) signal. Thus, while each slice may receive and use a single CLK signal and a signal SR signal, each slice may receive up to 4 different CE signals. The FF components assigned to a same subgroup of a slice must use the same CE signal. In other words, each slice can support 1 CLK signal, 1 SR signal, and up to 4 different CE signals. Though not illustrated, synchronized and asynchronized FF components may not share the same slice.

Referring to the foregoing, once a FF component is assigned to a slice, all other FF components with different CLK signals and/or different SR signals are no longer permitted to use that slice. Further, FF components with different CE signals may not share the same subgroup 302. In view of these resource-sharing restrictions of the underlying hardware of IC 124, as discussed, certain FF sites of IC 124 may be left unoccupied for a legal placement of circuit design 122 therein.

As discussed, a control set generally refers to a group of FF components that can share FF sites legally. In accordance with the inventive arrangements, EDA framework 120 is capable of processing circuit design 122 to detect several different types of control sets therein. For example, EDA framework 120 defines, and is capable of detecting, the following different types of control sets in circuit design 122: regular control sets, super control sets, and mega control sets. EDA framework 120 is capable of parsing circuit design 122 to detect the noted types of control sets therein.

A "regular control set" refers to a group of one or more FF components of circuit design 122 that have/share a same CLK signal, a same SR signal, and a same CE signal. A "super control set" refers to a group of one or more FF components of circuit design 122 that have/share a same CLK signal and a same SR signal. In the case of a super control set, the CE signal is not considered (e.g., is a "don't care"). That is, FF components in a same super control set may have different CE signals. A "mega control set" refers to a group of one or more FF components of circuit design 122 that have/share a same CLK signal. In the case of a super control set, neither the SR signal nor the CE signal is considered (e.g., both are "don't cares"). Thus, FF components in a same mega control set may have different SR signals and different CE signals.

In view of the foregoing, it may be seen that FF components of circuit design 122 that have a same regular control set (e.g., are in the same regular control set), are permitted to share any FF sites of the target IC (e.g., may be located in a same subgroup 302 of a slice). FFs of circuit design 122 with the same super control set (e.g., are in the same super control set) can share FF sites in the same slice, but may or may not legally be within the same subgroup 302. FF components of circuit design 122 that have a same mega control set and a different super control set cannot share the same slice of a CLB.

Figure 4A:
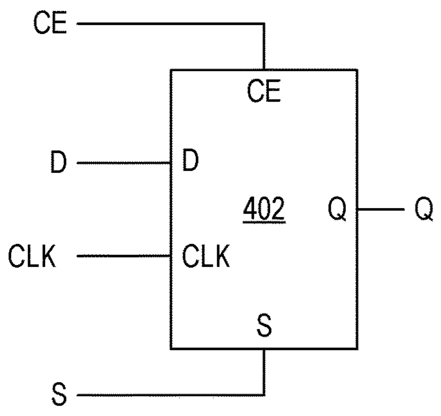
FIGS. 4A, 4B, and 4C illustrate examples of control set reduction operations that may be performed on a circuit design.
Figure 4B:
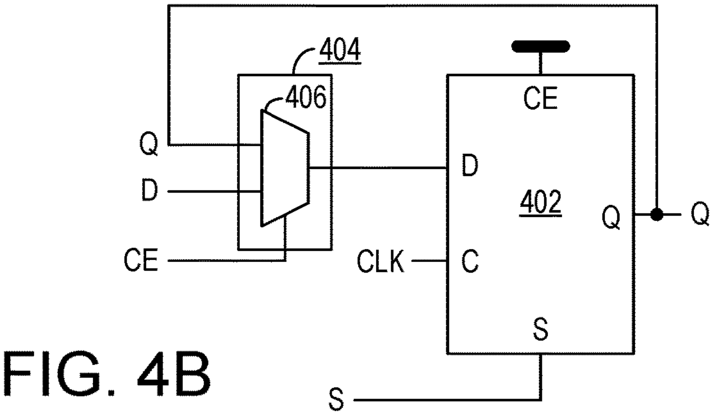
Figure 4C:
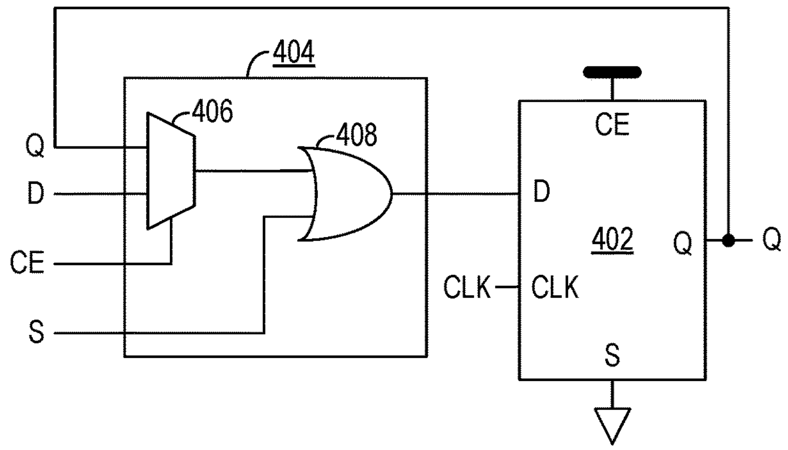

FIGS. 4A, 4B, and 4C illustrate examples of control set optimization that may be performed on FF components of a circuit design. The examples of FIGS. 4A, 4B, and 4C are directed to FF components that have, or are configured to use, a set (S) signal. FIG. 4A illustrates an example of a FF component 402 that receives the following signals: data (D), CE, CLK, and S. FF component 402 generates an output signal shown as Q.

FIG. 4B illustrates a CE-only control set reduction as performed on FF component 402. In the example of FIG. 4B, a LUT component 404 has been inserted in front of FF component 402 to receive, as inputs, the Q signal and the D signal. The CE signal is provided to LUT component 404 as a selector signal. The CE input pin of FF component 402 is tied to Vcc. In this example, LUT component 404 may operate as a switch 406 that outputs the value of the Q signal or the value of the D signal therefrom to the D input pin of FF component 402 based on the value of the CE signal. In the example of FIG. 4B, the S signal is still provided to the S input pin of FF component 402.

FIG. 4C illustrates a CE control set reduction and an SR control set reduction as performed on FF component 402. In the example of FIG. 4C, LUT component 404 has been placed in front of FF component 402 to receive, as inputs, the Q signal and the D signal. The CE signal is provided to LUT component 404 as a selector signal. The CE input pin of FF component 402 is tied to Vcc. In this example, LUT component 404 may operate as a switch 406 coupled to a logical OR gate 408. That is, LUT component 404 implements the following functionality. LUT component 404 selectively passes the value of signal Q or the value of signal D therefrom to a first input of logical OR gate 408. The S signal is provided to the second input of logical OR gate 408, with the output of logical OR gate 408 being provided to the D input pin of FF component 402. The S input pin of FF component 402 is tied to ground.

Figure 5A:
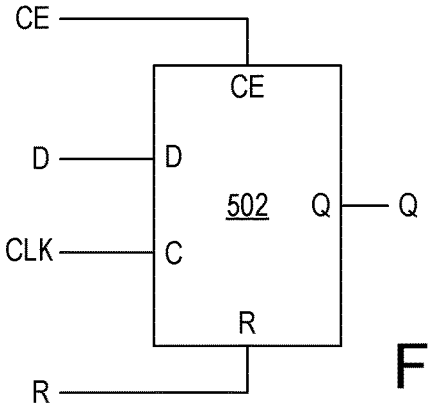
FIGS. 5A, 5B, and 5C illustrate additional examples of control set reduction operations that may be performed on a circuit design.
Figure 5B:
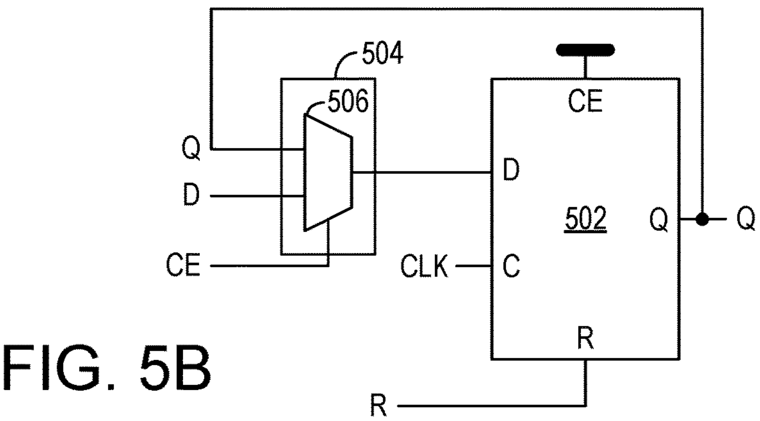
Figure 5C:
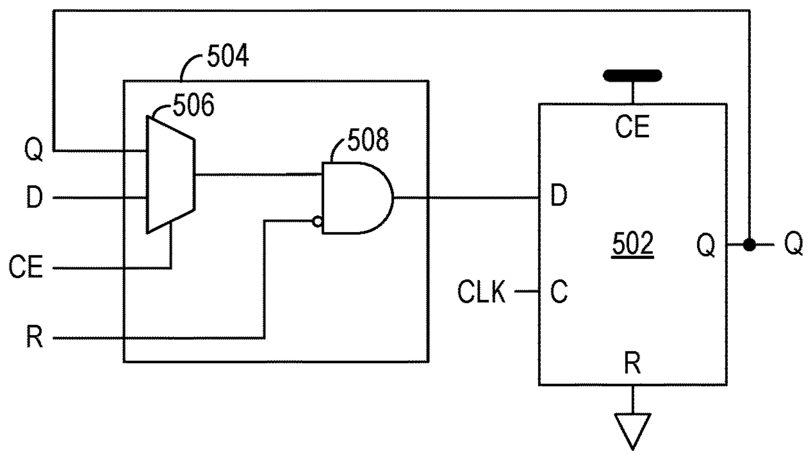

FIGS. 5A, 5B, and 5C illustrate examples of control set optimization that may be performed on FF components of a circuit design. The examples of FIGS. 5A, 5B, and 5C are directed to FF components that have, or are configured to use, a reset (R) signal. FIG. 5A illustrates an example of a FF component 502 that receives the following signals: data (D), CE, CLK, and R. FF component 502 generates an output signal shown as Q.

FIG. 5B illustrates a CE-only control set reduction performed on FF component 502. In the example of FIG. 5B, a LUT component 504 has been inserted in front of FF component 502 to receive, as inputs, the Q signal and the D signal. The CE signal is provided to LUT component 504 as a selector signal. The CE input pin of FF component 502 is tied to Vcc. In this example, LUT component 504 may operate as a switch 506 that outputs the value of signal Q or the value of signal D therefrom to the D input pin of FF component 502 based on the value of the CE signal. In the example of FIG. 5B, the R signal is still provided to the R input pin of FF component 402.

FIG. 5C illustrates CE control set reduction and SR control set reduction as performed on FF component 502. In the example of FIG. 5C, a LUT component 504 has been placed in front of FF component 502 to receive, as inputs, the Q signal and the D signal. The CE signal is provided to LUT component 504 as a selector signal. The CE input pin of FF component 502 is tied to Vcc. In this example, LUT component 504 may operate as a switch 506 coupled to a logical AND gate 508. That is, LUT component 504 implements the following functionality. LUT component 504 selectively passes the value of signal Q or the value of signal D therefrom to a first input of logical AND gate 508. The R signal is provided to the second input of logical AND gate 508, which is an inverting input. The output of logical AND gate 508 is coupled to the D input pin of FF component 502. The R input pin of FF component 502 is tied to ground.

Referring to FIGS. 4B and 5B, the CE-only reduction applied to FF components that are within the same super control set and different regular control sets may be used to convert the FF components into being in the same regular control set. Thus, FF components that, prior to the CE-only control set reduction, could not be placed in the same subgroup, can be placed in the same subgroup post CE-only control set reduction.

Referring to FIGS. 4C and 5C, the SR control set reduction and the CE control set reduction applied to FF components in the same mega control set and different regular control sets may be used to convert FF components into being in the same regular control set. For purposes of illustration, in a given circuit design, one control set will have FF components with the S/R pin tied to ground and the CE pin tied to Vcc. For this particular control set, no signals drive the S/R pin or the CE pin of the FF components. As a FF component undergoes CE-only control set reduction, that FF component effectively joins this particular control set, resulting in a larger and more flexible control set group leading a more densely packed circuit design and improved overall usage of IC resources.

In performing the control set reductions described, in some cases, tying the CE input pin of a FF component to Vcc may increase the dynamic power consumed by that FF component. The control set optimizations described herein, however, may improve the overall QoR of the circuit design (e.g., improve QoR of circuit design placement, reduce overall wirelength of the circuit design as placed and/or routed, and reduce routing congestion of the circuit design). The improved QoR may lead to reduced power consumption notwithstanding the increase in dynamic power from tying the CE input pins of FF component(s) to Vcc.

The various control set reduction techniques described in connection with FIGS. 4 and 5 may not be applied to every FF component of circuit design 122. Some FF components such as asynchronized FF components, FF components that may not be optimized because of user and/or tool specified restrictions, and FF components having timing slack that is worse than a threshold timing slack, may not be subjected to the control set optimization described herein. The set of FF components that are not subjected to control set optimization (e.g., one or more of the control set reductions described herein), are referred to herein as "nonreducible FF components." While nonreducible FF components may not be optimized as described within this disclosure, it should be appreciated that such FF components may share FF resources (e.g., a slice and/or subgroup) with reducible FF components in reference to the FF components that are subject to control set reduction. This capability facilitates improved FF site utilization for circuit design 122 with respect to IC 124.

In the examples of FIGS. 4 and 5, it should be appreciated that the LUT component, as inserted before the FF component, is configured to implement the logical functions described.

Figure 6A:
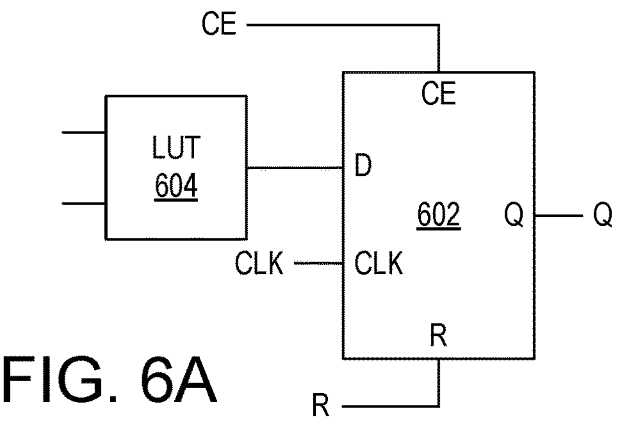
FIGS. 6A, 6B, and 6C, taken collectively, illustrate an example of lookup-table (LUT) reduction that may be performed on a circuit design.
Figure 6B:
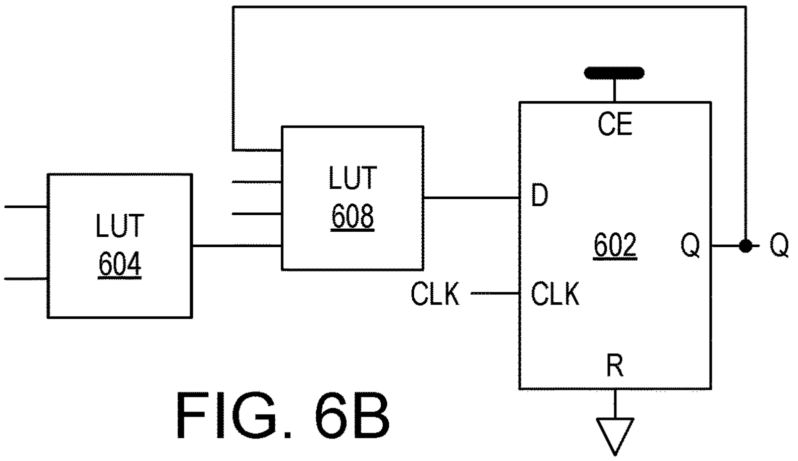
Figure 6C:
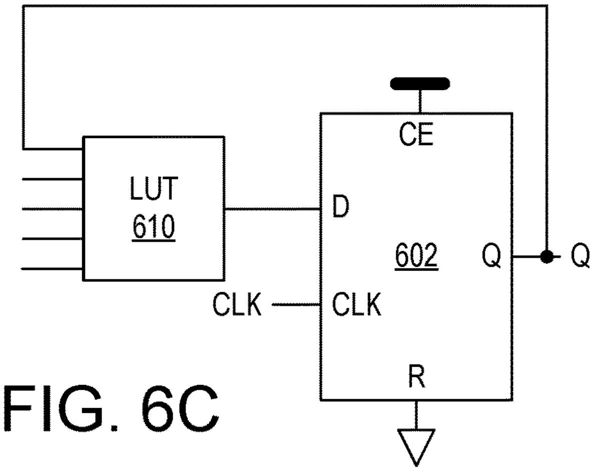

FIGS. 6A, 6B, and 6C, taken collectively, illustrate an example of LUT reduction that may be performed for selected FF components after having performed control set reduction that results in the insertion of an additional LUT component. In the example of FIG. 6A, a FF component 602 of circuit design 122 already has a LUT component 604 in front. After performing control set reduction as described in connection with FIGS. 4 and/or 5, an additional LUT component 608 is inserted between LUT component 604 and FF component 602 (e.g., before the D input pin of FF component 602).

In one or more example implementations, the additional delay incurred by signals traversing through a LUT component may be characterized for a known circuit architecture (e.g., IC 124). That value may be used to estimate the additional delay incurred by signals in consequence of inserting LUT component 608. In one or more example implementations, EDA framework 120 may calculate the change in delay that occurs in moving from FIG. 6A to FIG. 6B for signals coupled to the D input pin of FF component 602.

In one or more example implementations, in cases where the timing of the signal path is critical or nearly critical, the insertion of addition logic such as LUT component 608 may cause a timing error. In cases where the D input pin of a FF component is driven by a small LUT component, EDA framework 120 may, in some cases, reduce the LUT components used by merging the newly inserted LUT component 608 with the existing LUT component 604. EDA framework 120 is capable of performing this operation as illustrated in FIG. 6C if the total number of unique external signals provided to LUT components 604 and 608 is less than the total number of inputs that may be received by a LUT component. In this example, LUT component 610 may receive up to 6 input signals so that LUT reduction may be performed. That is, LUT component 604 receives 2 signals and LUT component 608 receives 3 signals (the output signal from LUT component 604 is excluded from the calculation). As the total is 6 or less, EDA framework 120 may perform the LUT reduction illustrated in FIG. 6C.

EDA framework 120 can generate the truth table of the new LUT component 610 by enumerating all possible input combinations of inputs. With the change illustrated in FIG. 6C, the timing of logic level(s) feeding FF component 602 may be preserved. In one or more example implementations, EDA framework 120 may calculate the reduction in delay that may be achieved by performing the operation illustrated in FIG. 6C as (merged LUT delay)-(original LUT delay).

Figure 7:
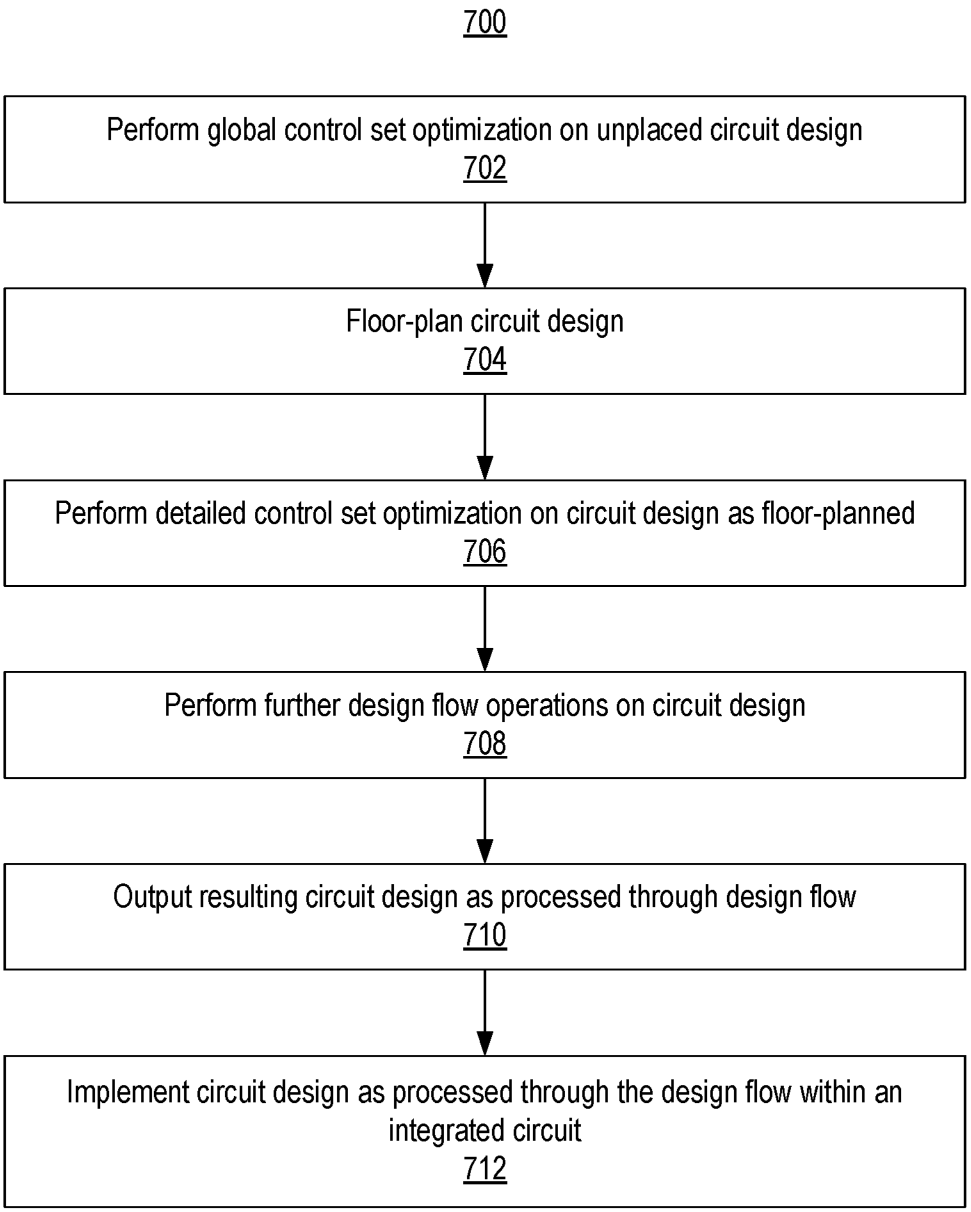
FIG. 7 illustrates an example method of implementing a circuit design within a target integrated circuit (IC).

FIG. 7 illustrates an example method 700 of implementing circuit design 122 within IC 124. For example, method 700 illustrates a design flow that may be performed by EDA framework 120 as executed by data processing system 100. Method 700 may begin in a state where circuit design 122 has been synthesized into a netlist. At this stage of the design flow, circuit design 122 is unplaced. As such, no location information is available for the components of circuit design 122.

Accordingly, in block 702, EDA framework 120 is capable of performing global control set optimization on the unplaced version of circuit design 122. The global control set optimization of block 702 includes performing one or more of the control set reductions described in connection with FIGS. 4 and/or 5. As noted, in block 702, nonreducible FF components may be excluded from the control set reductions. In one or more example implementations, LUT reduction may also be performed in combination with the control set reductions described.

In block 704, subsequent to performing global control set optimization, EDA framework 120 floor-plans circuit design 122. For example, in block 704, EDA framework 120 is capable of assigning components of circuit design 122 to particular floor-planning regions of IC 124. As an illustrative and non-limiting example, IC 124, as the target IC, may be subdivided into a plurality of regions each including one or more circuit blocks. The floor-planning performed in block 704 does not assign the components to particular sites of IC 124. That is, EDA framework 120 does not assign the components of circuit design 122 to particular x-y coordinates of IC 124 that correspond to legal sites of a circuit block, but rather assigns the components of circuit design 122 to the floor-planning regions of IC 124.

In block 706, EDA framework 120 performs detailed control set optimization on circuit design 122 as floor-planned from block 704. The detailed control set optimization of block 706 includes performing one or more of the control set reductions described in connection with FIGS. 4 and/or 5.

In block 708, EDA framework 120 performs additional operations as part of the design flow. For example, as part of block 708, EDA framework 120 may perform a global placement operation. The global placement operation is similar to the floor-planning operation previously described in that components are assigned to global placement regions of IC 124. The global placement regions are smaller in size than the floor-planning regions. For example, a given floor-planning region may include a plurality of global placement regions therein. In this regard, because components are assigned to particular global placement regions that exist within the particular floor-planning region to which the components were already assigned, global placement may be considered a refinement to floor-planning.

In one or more example implementations, the floor-planning described and/or the global placement described may assign components to particular coordinates as opposed to regions. In such cases, the assigned locations may not necessarily coincide with a location of a programmable hardware resource or site on IC 124. The assignment of components performed during global placement may be more accurate (e.g., have a higher granularity) than the assignment performed during floor-planning.

Following global placement, EDA framework 120 may perform a detailed placement. In detailed placement, components of circuit design 122 are assigned to particular legal sites (e.g., locations) within the respective global placement regions to which the components were assigned. Following placement, EDA framework 120 may perform routing of circuit design 122. Other operations optionally may be performed on circuit design 122 such as timing and/or power optimizations. Further, EDA framework 120 may generate configuration data such as a configuration bitstream. The configuration data, when loaded into IC 124, physically realizes circuit design 122 therein.

In block 710, EDA framework 120 is capable of outputting the resulting circuit design 122' as processed through the design flow. In block 712, the processed circuit design 122' may be implemented in IC 124. For example, for one or more types of ICs, circuit design 122' may be loaded into IC 124 to physically realize the circuit design therein.

In the example of FIG. 7, EDA framework 120 performs control set optimization prior to floor-planning before any location data is known about the various components of circuit design 122. EDA framework 120 also performs control set optimization post floor-planning once at least some location data is known about the various components of circuit design 122. In one or more other example implementations, global control set optimization of block 702 may be performed while detailed control set optimization of block 706 is omitted. In one or more other example implementations, detailed control set optimization of block 706 may be performed while global control set optimization of block 702 is omitted.

Figure 8:
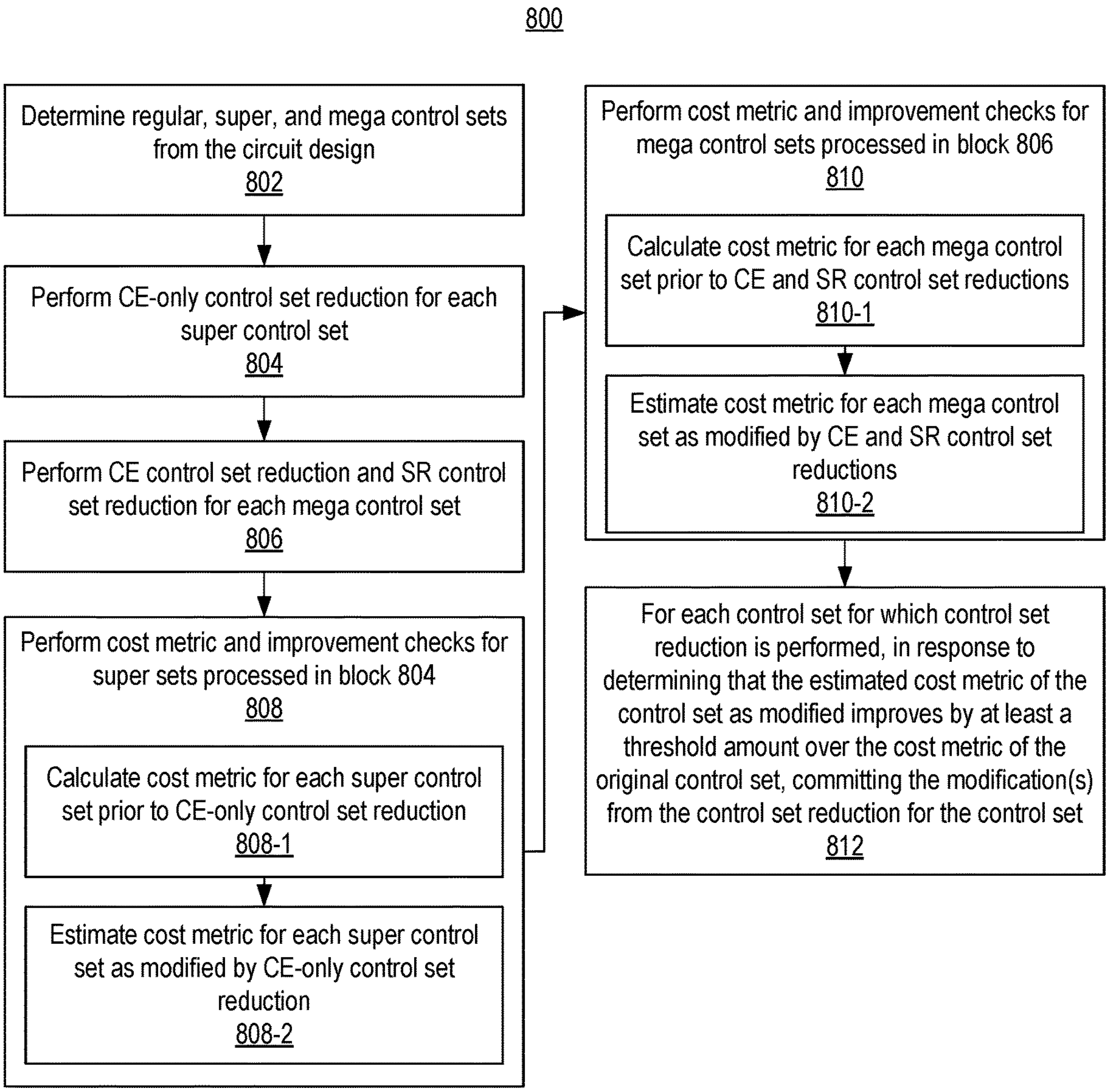
FIG. 8 illustrates an example method of implementing control set optimization for a circuit design.

FIG. 8 illustrates an example method 800 of implementing control set optimization for circuit design 122. Method 800 may be performed to implement the global control set optimization of block 702 of FIG. 7 and/or the detailed control set optimization of block 706 of FIG. 7.

In one or more example implementations, the particular way in which the control set optimization technique illustrated in FIG. 8 may vary according to whether global control set optimization or detailed control set optimization is being performed. In the case of global control set optimization, for example, without the benefit of location information for components, FF components being processed may be allocated to a particular number of groups. Method 800 may be performed for each group of FF components independently.

In the case of detailed control set optimization, for example, having the benefit of location information for components, method 800 may be applied to those FF components located within a defined window (e.g., a designated region of IC 124). Method 800 may be performed iteratively as the window is moved over IC 124.

In block 802, EDA framework 120 determines regular, super, and meta control sets from circuit design 122. For example, EDA framework 120 analyzes the various signals (e.g., CLK, CE, SR) for FF components of circuit design 122 and creates one or more regular controls sets, one or more super controls sets, and one or more meta controls sets based on the control set signals.

In block 804, EDA framework 120 performs CE-only control set reduction for each super control set. For example, for each super control set, EDA framework 120 performs the CE-only control set for FF components as illustrated in FIG. 4B and/or FIG. 5B.

In block 806, EDA framework 120 performs CE control set reduction and SR control set reduction for each mega controls set. For example, EDA framework 120 performs the CE control set reduction and SR control set reduction for FF components of each mega control set as illustrated in FIG. 4C and/or FIG. 5C.

In bock 808, EDA framework 120 performs cost metric and improvement checks for the super control sets processed in block 804. For example, in block 808-1, EDA framework 120 calculates a cost metric for each super control set for which CE-only control set reduction was performed in block 804 as that super control set existed prior to the CE-only control set reductions (e.g., for the super control set in its original form). In block 801-2, EDA framework 120 estimates the cost metric for each super control set modified by the CE-only control set reductions performed in block 804.

In one or more example implementations, as part of determining cost estimates in block 808-2 for each super control set as modified, EDA framework 120 may perform LUT reduction as illustrated in FIG. 6. In this regard, any estimates of the cost metric for each super control set as modified by the CE-only control set reductions also reflects LUT reduction(s).

In bock 810, EDA framework 120 performs cost metric and improvement checks for the mega control sets processed in block 806. For example, in block 810-1, EDA framework 120 calculates a cost metric for each mega control set for which control set reduction was performed in block 806 as that mega control set existed prior to the CE and SR control set reductions (e.g., for the mega control set in its original form). In block 810-2, EDA framework 120 estimates the cost metric for each mega control set modified by the CE and SR control set reductions performed in block 806.

In one or more example implementations, as part of determining cost estimates in block 810-2 for each mega control set as modified, EDA framework 120 may perform LUT reduction as illustrated in FIG. 6. In this regard, any estimates of the cost metric for each mega control set as modified by the CE and SR control set reductions also reflects LUT reduction(s).

In one or more other example implementations, CE-only control set reduction of block 804 and CE control set reduction and the SR control set reduction of block 806 each may include LUT reduction as illustrated in FIG. 6. That is, as part of performing detailed and/or global control set reduction, LUT reduction may be included. LUT reduction may be performed following and/or as part of CE-only control set reduction. LUT reduction may be performed following and/or as part of SR and CE control set reduction.

In block 812, for each control set for which control set reduction was performed, in response to determining that the estimated cost metric of the control set as modified improved by at least a threshold amount over the cost metric of the original control set, EDA framework 120 commits the modifications(s) from the control set reduction operation(s) for the control set.

In one or more other example implementations, one or more of the operations (e.g., 802-812) and/or sub-operations (e.g., 808-1, 808-2, 810-1, and/or 810-2) illustrated in FIG. 8 may be implemented in a different order than illustrated.

In the example of FIG. 8, the cost metric may be calculated as described below. Given a set of FF components, EDA framework 120 computes the total FF demand by assuming that all FF components of circuit design 122 are placed in the most compact way. That is, EDA framework 120, in calculating the cost metrics, presumes that all FF components share slice resources as much as possible.

Based on the circuit architectures illustrated in FIGS. 2 and 3, for a regular control set i with $n_i$ FF components, at least $\lceil n_i/4 \rceil$ subgroups are needed. For purposes of illustration, $\lceil * \rceil$ denotes the ceiling operation. Also, for a total of $m_j$ subgroups that share the same super control set j, the subgroups consume at least $\lceil m_j/4 \rceil$ slices. Accordingly, the total demand (e.g., cost) of a given set of FF components may be determined as illustrated in the example of Expression 1. Expression 1 determines $COST_{FF}$ as the number of slices needed to place the set of FF components. The resulting value of Expression 1 is expressed in units of slices.

$$COST_{FF} = \sum_{j \in C^s} \left\lceil \frac{\sum_{i \in C_j^r} \left\lceil \frac{n_i}{4} \right\rceil}{4} \right\rceil \tag{1}$$

In the example of Expression 1, $C_s$ denotes the set of all super control sets and Cf denotes the set of all regular control sets in the super control set j. In the example of Expression 1, optimizing for smaller $n_i$ generally gives a larger relative improvement. As such, in one or more example implementations, EDA framework 120 prioritizes small control sets for optimization (reduction).

Performing control set reduction with extra LUT reduction has the potential to increase LUT demand. Since unreasonably high LUT demand can reduce placement quality, LUT demand may be penalized using a cost function such as that illustrated in the example of Expression 2.

$$COST_{LUT} = e^{max(d-d_{th},0)} - 1 \tag{2}$$

In the example of Expression 2, d denotes the total LUT demand and $d_{th}$ denotes a pre-defined LUT demand threshold. The example of Expression 2 penalizes LUT demand exponentially when LUT demand exceeds the threshold $d_{th}$.

The FF cost function of Expression 1 and the LUT cost function of Expression 2 may be combined to provide a final cost function illustrated in the example of Expression 3 that may be used as the cost metric.

$$COST = COST_{FF} + \alpha COST_{LUT} \tag{3}$$

In the example of Expression 3, α is a normalization factor that may be used to balance the weight between the LUT costs and the FF costs.

Listing 1 below is example pseudo-code illustrating the operations described in connection with FIG. 8. In the example of Listing 1, the input being processed is "V," which is a set of instances (FF components) to be optimized, e is the cost of improvement tolerance, and the output is an optimized logic equivalent modification to V with an improved cost. The objective of FIG. 8 and Listing 1 is to find a logic equivalent modification on V with an improved cost as determined using Expression 3.

Listing 1

```
Function ControlSetReduction(V, ϵ):
  foreach super control set c ∈ C^s do
    ControlSetReductionKernel(V, ϵ) with CE-only reduction
  end
  foreach mega control set c ∈ C^m do
    ControlSetReductionKernel(V, ϵ) with SR/CE reduction
  end
end
Function ControlSetReductionKernel(V, ϵ):
  Compute V' by performing
    control set reduction on FFs ∈ V and
    LUT reduction on LUTs ∈ V
  Compute COST (V) and COST (V')
  if COST(V ) − COST(V ') > ϵ then
    V ← V'
  end
 end
```

In lines 1-8, EDA framework 120 performs reduction for each super control set and for each mega control set. For super control sets, as FF components share the same CLK signal and SR signal, EDA framework 120 performs CE-only reduction as illustrated at line 3. For mega control sets, since only CLK signals are shared, EDA framework 120 performs CE control set reduction and SR control set reduction as illustrated at line 6.

Lines 9-15 describe the kernel function that performs the actual control set reduction operations. In Listing 1, EDA framework 120 first estimates the cost of the modified instance set V' with control set reduction applied and LUT reduction applied on the original instance set V as illustrated at lines 10-11. Subsequently, if the cost improvement of V' is large enough (e.g., greater than E), EDA framework 120 commits the changes at line 13. Otherwise, when the improvement does not exceed E, EDA framework 120 keeps the original instance set V unchanged. As such, the cost estimation of V' described at line 10 may be performed without editing the netlist. Modifications to the netlist (e.g., circuit design 122) are only performed during the commit operation illustrated at line 13.

In some cases, blindly reducing all FF components in the same control set as depicted at line 10 of Listing 1 may cause excessive LUT overhead. In one or more other example implementations, EDA framework 120 may perform control set reduction only on those FF components that are overflowing from subgroups. In other words, in one or more example implementations, given a control set with n FF components, EDA framework 120 may be configured to select (n mod 4) FF components of the set for CE-only reduction. In a super control set with m subgroups, EDA framework 120 may be configured to select only (m mod 4) subgroups for CE control set reduction and for CE control set reduction. By limiting the application of the control set reduction operations, EDA framework 120 is able to achieve a reasonable amount of control set reduction with minimized LUT overhead.

In one or more example implementations, given a subset of FF components from a set of V for reduction, EDA framework 120 may be configured to give reducible FF components determined to have a better (e.g., higher) estimated post-reduction timing slack priority for processing to avoid a degradation in QoR. That is, of the set of FF components to be processed, EDA framework 120 may apply control set reduction in order from those with highest estimated post-processing reduction in slack to the lowest. As noted, nonreducible FF components are not processed (e.g., omitted from the control set reduction operations described).

As discussed, in cases where little to no placement information is available when performing control set reduction (e.g., as performed prior to floor-planning), EDA framework 120 may use a sampling technique to estimate the cost of FF components. In one or more example implementations, EDA framework 120 divides circuit design 122 into N groups, where N is greater than 1. EDA framework 120 may evenly distribute the FF components among the N groups. EDA framework 120 uses the cost of each group as an estimated cost for the whole circuit design as each of the N groups is processed individually through the operations of FIG. 8 (e.g., Listing 1).

More particularly, the operations described may be performed on a per-control set basis and summed together to provide the cost of the entire circuit design. Without placement information, applying Expression 1 to all FF components may provide results that are too optimistic. To avoid this scenario, in one or more example implementations, an assumption is made that the FF components are placed evenly for the circuit design. The FF components are split into N groups as noted. Assuming there are m FF components for a given control set, there are m/N FF components in each group. Applying to techniques described herein, the number of FF components needed to perform CE-only control set reduction and the number of FF components needed to perform CE and SR control set reduction are known for each group. Since placement information is not yet available, the FF components selected may be the FF components having the highest priority in the entire circuit design. It should be appreciated that if mod $(m/N) \neq 0$, the number of FF components in some groups is floor(m/N) and the number of FF components in the remaining groups is floor(m/N)+1.

Figure 9:
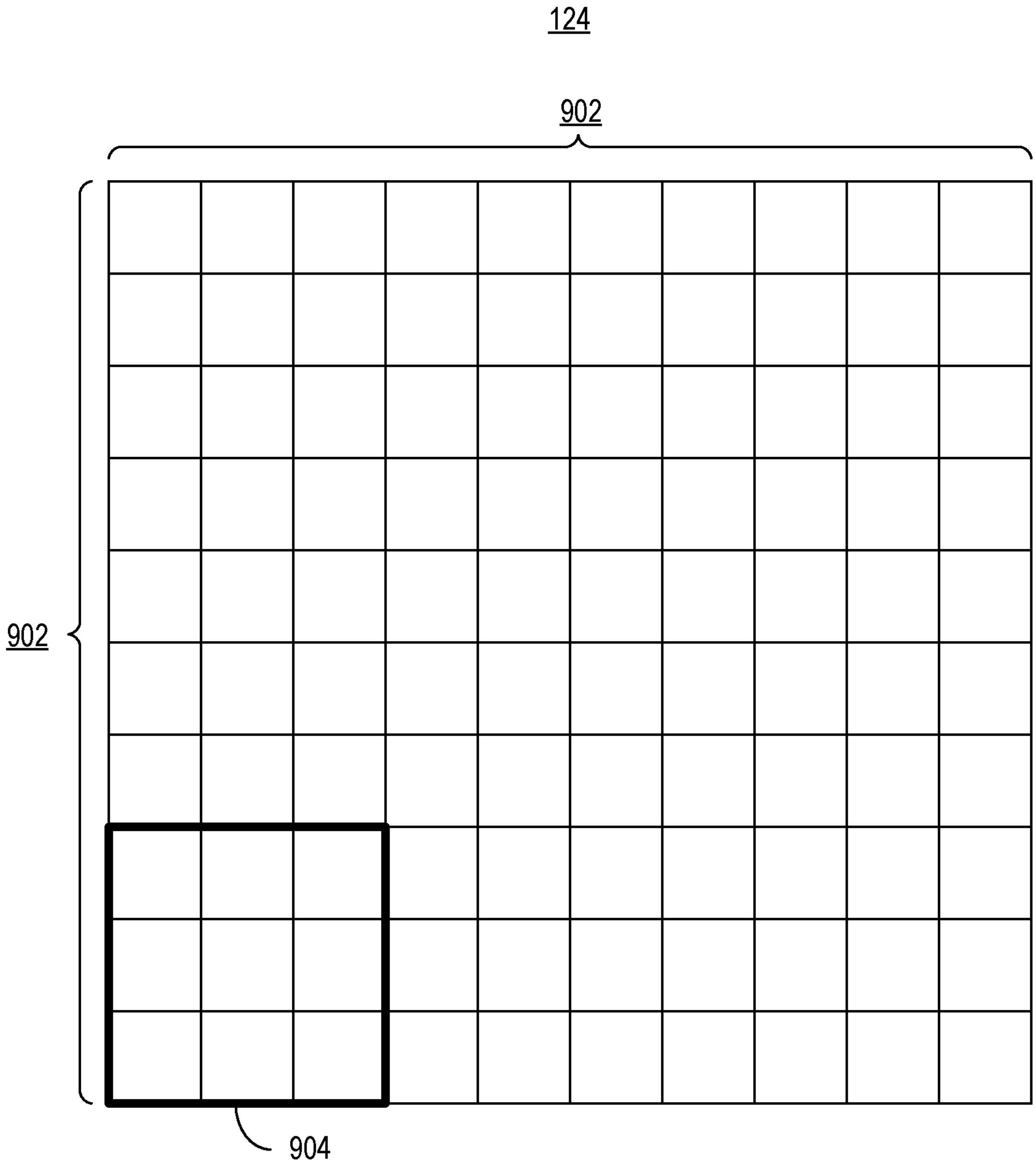
FIG. 9 illustrates an example of a windowing technique that may be used to perform control set reduction in cases where at least some location information is available for the circuit design.

FIG. 9 illustrates an example of a windowing technique that may be used to perform control set reduction in cases where at least some location information is available for circuit design 122 (e.g., for block 706 of FIG. 7). In the example of FIG. 9, EDA framework 120 generates instance sets based on a sliding window approach. As shown, IC 124 may be viewed as a 2-dimensional grid of slices 902 (10×10 in the example). In FIG. 9, an M×N window 904 is shown (e.g., measured in slices), where M is the width and N is the height. Window 904 may be moved over IC 124 (e.g., horizontally and vertically) with a step size of s slices, where $s \leq M$ in the horizontal direction and $s \leq N$ in the vertical direction. In this example, the step size in the vertical and horizontal directions is the same. In other example implementations, the horizontal step size may be different from the vertical step size, though the horizontal step size must be less than or equal to M and the vertical step size must be less than or equal to N. This ensures there is no gap in sliding the window.

At each window location, instances (e.g., FF components) falling into the window for the floor-planned solution form a set V for use in performing detailed control set reduction. In the example, window 904 is 3×3. Window 904 may be moved horizontally across IC 124, then up and across, etc. Alternatively, window 904 may be moved vertically up IC 124, then over (across), and vertically down, etc. Window 904 may be moved so that consecutive locations of window 904 as slid will abut one another and do not overlap (e.g., where the stride in any direction is equal to the respective dimension of the window in the direction of movement). In one or more other examples, consecutive locations of window 904 as slid may overlap one another (e.g., the stride in one or both directions is less than the respective dimension of the window in the direction of movement). As an illustrative and non-limiting example, given a window size of 3×3 and equal horizontal and vertical strides s, s may be set equal to 3, 2, or 1.

Figure 10:
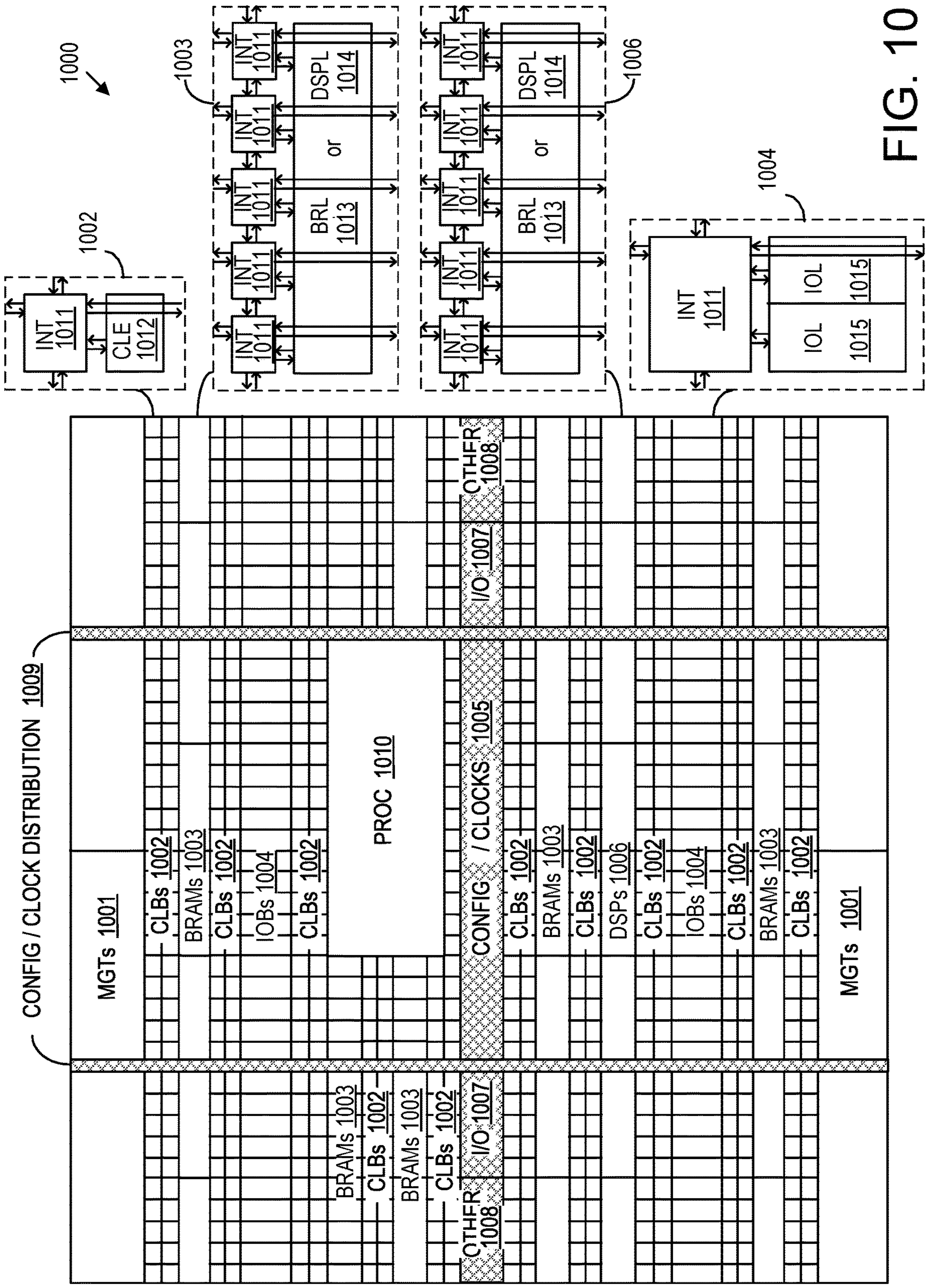
FIG. 10 illustrates an example architecture for an IC that may be used to implement a circuit design.

FIG. 10 illustrates an example architecture 1000 for an IC such as IC 124. In one aspect, architecture 1000 may be implemented within a programmable IC. A programmable IC is an IC with at least some programmable circuitry. Programmable circuitry may include programmable logic. For example, architecture 1000 may be used to implement a field programmable gate array (FPGA). Architecture 1000 may also be representative of a system-on-chip (SoC) type of IC. An example of an SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1000 includes several different types of programmable circuit, e.g., logic, blocks. For example, architecture 1000 may include a large number of different programmable tiles including multi-gigabit transceivers (MGTs) 1001, configurable logic blocks (CLBs) 1002, random-access memory blocks (BRAMs) 1003, input/output blocks (IOBs) 1004, configuration and clocking logic (CONFIG/CLOCKS) 1005, digital signal processing blocks (DSPs) 1006, specialized I/O blocks 1007 (e.g., configuration ports and clock ports), and other programmable logic 1008 such as digital clock managers, analog-to-digital converters, system monitoring logic, and so forth.

In some ICs, each programmable tile includes a programmable interconnect element (INT) 1011 having standardized connections to and from a corresponding INT 1011 in each adjacent tile. Therefore, INTs 1011, taken together, implement the programmable interconnect structure for the illustrated IC. Each INT 1011 also includes the connections to and from the programmable logic element within the same tile, as shown by the examples included at the right of FIG. 10.

For example, a CLB 1002 may include a configurable logic element (CLE) 1012 that may be programmed to implement user logic plus a single INT 1011. A BRAM 1003 may include a BRAM logic element (BRL) 1013 in addition to one or more INTs 1011. Typically, the number of INTs 1011 included in a tile depends on the height of the tile. As pictured, a BRAM tile has the same height as five CLBs, but other numbers (e.g., four) also may be used. A DSP tile 1006 may include a DSP logic element (DSPL) 1014 in addition to an appropriate number of INTs 1011. An IOB 1004 may include, for example, two instances of an I/O logic element (IOL) 1015 in addition to one instance of an INT 1011. The actual I/O pads connected to IOL 1015 may not be confined to the area of IOL 1015.

In the example pictured in FIG. 10, the shaded area near the center of the die, e.g., formed of regions 1005, 1007, and 1008, may be used for configuration, clock, and other control logic. Shaded areas 1009 may be used to distribute the clocks and configuration signals across the breadth of the programmable IC.

Some ICs utilizing the architecture illustrated in FIG. 10 include additional logic blocks that disrupt the regular columnar structure making up a large part of the IC. The additional logic blocks may be programmable blocks and/or dedicated circuitry. For example, a processor block depicted as PROC 1010 spans several columns of CLBs and BRAMs.

In one aspect, PROC 1010 may be implemented as dedicated circuitry, e.g., as a hardwired processor, that is fabricated as part of the die that implements the programmable circuitry of the IC. PROC 1010 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1010 may be omitted from architecture 1000 and replaced with one or more of the other varieties of the programmable blocks described. Further, such blocks may be utilized to form a "soft processor" in that the various blocks of programmable circuitry may be used to form a processor that can execute program code as is the case with PROC 1010.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 10 that are external to PROC 1010 such as CLBs 1002 and BRAMs 1003 are considered programmable circuitry of the IC.

In general, the functionality of programmable circuitry is not established until configuration data is loaded into the IC. A set of configuration bits may be used to program programmable circuitry of an IC such as an FPGA. In some cases, configuration data may also be referred to as a "configuration bitstream." In general, programmable circuitry is not operational or functional without first loading configuration data into the IC. The configuration data effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of configuration data. Hardwired circuitry is generally considered to have dedicated circuit blocks and interconnects, for example, that are functional without first loading configuration data into the IC, e.g., PROC 1010.

In some instances, hardwired circuitry may have one or more operational modes that can be set or selected according to register settings or values stored in one or more memory elements within the IC. The operational modes may be set, for example, through the loading of configuration data into the IC. Despite this ability, hardwired circuitry is not considered programmable circuitry as the hardwired circuitry is operable and has a particular function when manufactured as part of the IC.

In the case of an SoC, the configuration data may specify the circuitry that is to be implemented within the programmable circuitry and the program code that is to be executed by PROC 1010 or a soft processor. In some cases, architecture 1000 includes a dedicated configuration processor that loads the configuration data to the appropriate configuration memory and/or processor memory. The dedicated configuration processor does not execute user-specified program code. In other cases, architecture 1000 may utilize PROC 1010 to receive the configuration data, load the configuration data into appropriate configuration memory, and/or extract program code for execution.

FIG. 10 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 10 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1010 within the IC are for purposes of illustration only and are not intended as limitations.

The terminology used herein is for the purpose of describing particular embodiments only and is not intended to be limiting. Notwithstanding, several definitions that apply throughout this document are expressly defined as follows.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, "data processing system" means one or more hardware systems configured to process data, each hardware system including at least one hardware processor programmed to initiate operations and memory.

As defined herein, "execute" and "run" comprise a series of actions or events performed by the hardware processor in accordance with one or more machine-readable instructions. "Running" and "executing," as defined herein refer to the active performing of actions or events by the hardware processor. The terms run, running, execute, and executing are used synonymously herein.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "individual" and "user" each refer to a human being.

As defined herein, the term "hardware processor" means at least one hardware circuit. The hardware circuit may be configured to carry out instructions contained in program code. The hardware circuit may be an integrated circuit. Examples of a hardware processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the terms "one embodiment," "an embodiment," "in one or more embodiments," "in particular embodiments," or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the term "output" means storing in physical memory elements, e.g., devices, writing to display or other peripheral output device, sending or transmitting to another system, exporting, or the like.

As defined herein, the term "real-time" means a level of processing responsiveness that a user or system senses as sufficiently immediate for a particular process or determination to be made, or that enables the processor to keep up with some external process.

As defined herein, the term "soft" in reference to a circuit means that the circuit is implemented in programmable logic or programmable circuitry. Thus, a "soft processor" means at least one circuit implemented in programmable circuitry that is capable of carrying out instructions embodied as program instructions.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer-readable storage medium (or media) having computer-readable program instructions thereon for causing a processor to carry out aspects of the inventive arrangements described herein. Within this disclosure, the term "program code" is used interchangeably with the term "program instructions." Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:

distinguishing, using computer hardware, between super control sets that include circuit components of a circuit design having a same clock signal and a same set/reset signal and mega control sets that include circuit components of the circuit design having a same clock signal; and performing, using the computer hardware, control set optimization on the circuit design by:

performing a clock-enable-only control set reduction for each super control set through, at least in part, logic insertion, and performing a set/reset control set reduction and a clock-enable control set reduction for each mega control set through, at least in part, logic insertion; and selectively modifying the circuit design by committing changes from the control set reductions to the circuit design on a per control set basis based on an improvement of a cost metric for each control set wherein the circuit design, as modified, is implemented within an integrated circuit.

2. The method of claim 1, wherein the performing the control set optimization is performed prior to floor-planning the circuit design.

3. The method of claim 2, further comprising:

allocating flip-flops of the circuit design to a specified number of groups;

wherein the distinguishing between the super control sets and the mega control sets is performed on a per-group basis; and the performing the control set optimization on the circuit design is performed on a per-group basis.

4. The method of claim 2, further comprising:
floor-planning the circuit design; and
performing the control set optimization on the circuit design again subsequent to the floor-planning.

5. The method of claim 4, wherein the control set optimization, as performed on the circuit design subsequent to the floor-planning, is performed for each of a plurality of locations of a window moved across a target integrated circuit for the circuit design.

6. The method of claim 1, wherein:
for a selected super control set, processing fewer than all flip-flops of the selected super control set during the clock-enable-only control set reduction; and
for a selected mega control set including a plurality of subgroups, performing the set/reset control set reduction and the clock-enable control set reduction for fewer than all subgroups of the plurality of subgroups.

7. The method of claim 1, wherein non-reducible flip-flops of the circuit design are excluded from the control set reductions.

8. A system, comprising:
one or more hardware processors configured to initiate operations including:
distinguishing between super control sets that include circuit components of a circuit design having a same clock signal and a same set/reset signal and mega control sets that include circuit components of the circuit design having a same clock signal; and
performing control set optimization on the circuit design by:
performing a clock-enable-only control set reduction for each super control set through, at least in part, logic insertion, and performing a set/reset control set reduction and a clock-enable control set reduction for each mega control set through, at least in part, logic insertion; and
selectively modifying the circuit design by committing changes from the control set reductions to the circuit design on a per control set basis based on an improvement of a cost metric for each control set wherein the circuit design, as modified, is implemented within an integrated circuit.

9. The system of claim 8, wherein the performing the control set optimization is performed prior to floor-planning the circuit design.

10. The system of claim 9, wherein the one or more hardware processors are configured to initiate operations further comprising:
allocating flip-flops of the circuit design to a specified number of groups;
wherein the distinguishing between the super control sets and the mega control sets is performed on a per-group basis; and
the performing the control set optimization on the circuit design is performed on a per-group basis.

11. The system of claim 9, wherein the one or more hardware processors are configured to initiate operations further comprising:
floor-planning the circuit design; and
performing the control set optimization on the circuit design again subsequent to the floor-planning.

12. The system of claim 11, wherein the control set optimization, as performed on the circuit design subsequent to the floor-planning, is performed for each of a plurality of locations of a window moved across a target integrated circuit for the circuit design.

13. The system of claim 8, wherein:
for a selected super control set, processing fewer than all flip-flops of the selected super control set during the clock-enable-only control set reduction; and
for a selected mega control set including a plurality of subgroups, performing the set/reset control set reduction and the clock-enable control set reduction for fewer than all subgroups of the plurality of subgroups.

14. The system of claim 8, wherein non-reducible flip-flops of the circuit design are excluded from control the set reductions.

15. A computer program product comprising one or more computer readable storage mediums having program instructions embodied therewith, wherein the program instructions are executable by computer hardware to cause the computer hardware to initiate executable operations comprising:
distinguishing between super control sets that include circuit components of a circuit design having a same clock signal and a same set/reset signal and mega control sets that include circuit components of the circuit design having a same clock signal; and
performing control set optimization on the circuit design by:
performing a clock-enable-only control set reduction for each super control set through, at least in part, logic insertion, and performing a set/reset control set reduction and a clock-enable control set reduction for each mega control set through, at least in part, logic insertion; and
selectively modifying the circuit design by committing changes from the control set reductions to the circuit design on a per control set basis based on an improvement of a cost metric for each control set wherein the circuit design, as modified, is implemented within an integrated circuit.

16. The computer program product of claim 15, wherein the performing the control set optimization is performed prior to floor-planning the circuit design.

17. The computer program product of claim 16, wherein the program instructions are executable by the computer hardware to initiate operations further comprising:
allocating flip-flops of the circuit design to a specified number of groups;
wherein the distinguishing the super control sets and the mega control sets is performed on a per-group basis; and
the performing the control set optimization on the circuit design is performed on a per-group basis.

18. The computer program product of claim 16, wherein the program instructions are executable by the computer hardware to initiate operations further comprising:
floor-planning the circuit design; and
performing the control set optimization on the circuit design again subsequent to the floor-planning.

19. The computer program product of claim 18, wherein the control set optimization, as performed on the circuit design subsequent to the floor-planning, is performed for each of a plurality of locations of a window moved across a target integrated circuit for the circuit design.

20. The computer program product of claim 15, wherein:
for a selected super control set, processing fewer than all flip-flops of the selected super control set during the clock-enable-only control set reduction; and
for a selected mega control set including a plurality of subgroups, performing the set/reset control set reduction and the clock-enable control set reduction for fewer than all subgroups of the plurality of subgroups.

* * * * *